United States Patent [19]
Kim et al.

[11] Patent Number: 5,867,442
[45] Date of Patent: Feb. 2, 1999

[54] VARIABLE OUTPUT VOLTAGE BOOSTER CIRCUITS AND METHODS

[75] Inventors: Young-Bae Kim, Seoul; Hong-Sun Hwang, Kyungki-do, both of Rep. of Korea

[73] Assignee: Samsung Electronics Co., Ltd., Rep. of Korea

[21] Appl. No.: 772,172

[22] Filed: Dec. 19, 1996

[30] Foreign Application Priority Data

Dec. 21, 1995 [KR] Rep. of Korea ................. 1995-53533

[51] Int. Cl.$^6$ ........................................... G11C 7/00
[52] U.S. Cl. ........................................ 365/226; 365/222
[58] Field of Search ................................. 365/226, 227, 365/229, 222, 189.08, 189.11

[56] References Cited

U.S. PATENT DOCUMENTS 5,367,489  11/1994  Park et al. ............................. 365/226

*Primary Examiner*—David Nelms
*Assistant Examiner*—Trong Phan
*Attorney, Agent, or Firm*—Myers Bigel Sibley & Sajovac

[57] ABSTRACT

A method for controlling an internal booster power source in an integrated circuit memory device including a plurality of voltage booster active kickers includes the steps of activating a first predetermined number of the voltage booster active kickers during a first voltage boost operation for the integrated circuit memory device, and activating a second predetermined number of the voltage booster active kickers during a second voltage boost operation for the integrated circuit memory device. In particular, the second predetermined number is greater than the first predetermined number. Furthermore, the plurality of voltage booster active kickers can include four booster active kickers and the first predetermined number can be two and the second predetermined number can be four. Related memory devices are also discussed.

15 Claims, 5 Drawing Sheets

VARIABLE OUTPUT VOLTAGE BOOSTER CIRCUITS AND METHODS

FIELD OF THE INVENTION

The present invention relates to the field of integrated circuits and more particularly to the field of integrated circuit memory devices.

BACKGROUND OF THE INVENTION

Booster voltage generators are provided with integrated circuit memory devices to reduce the loss of data having a high logic level during active restoring operations by dropping a threshold voltage of the NMOS isolation gate. The loss of data having a high logic level may occur when multiple memory cells share a sense amplifier including a P-type sense amplifier (PSA) and an N-type sense amplifier (NSA) between isolation gates to reduce the size of the memory device. Moreover, as memory devices become more highly integrated, the load on a word line operating during a memory cycle may increase thus increasing the time required to enable the word line and decreasing the operating speed. In response, internal booster voltage generators have been provided on memory devices to reduce these problems. In particular, internal booster voltage generators may include a main pump to operate during stand-by conditions and an active kicker to operate when activated.

A dynamic random access memory (DRAM) generally operates using an optional refresh cycle wherein a dissipated charge varies according to the number of cells operating during a cycle. If the dissipated charge is greater than the supply charge, a memory malfunction may occur. Furthermore, if the supplied charge is greater than the dissipated charge, the reliability of the memory device may decrease as a result of the excessive charge.

A conventional method for controlling an internal booster power source of an integrated circuit memory device will now be discussed with reference to FIG. 1. This memory device includes a booster power line 13, a standby booster voltage generator 23, and a plurality of booster voltage active kickers 15, 17, 19, and 21. The standby booster voltage generator 23 is connected to the booster power line 13 and supplies a booster voltage Vpp to the memory device during standby operations. In this device, one-quarter of the memory cells are activated during a 4K refresh cycle as compared to the number of memory cells activated during a 1K refresh cycle. Accordingly, less power is dissipated during the 4K refresh cycle. By activating a reduced number of the memory cells, the memory device can operate using a reduced number of booster voltage active kickers.

If a sufficient number of booster voltage active kickers are provided so that any refresh cycle can be accommodated and if the refresh cycle is large, when fewer than all of the memory cells are activated excessive charge may cause an excessive voltage rise on the booster voltage power line thereby causing oxide breakdown, junction breakdown, or deterioration of the transistors. Referring now to FIG. 2, when the row address strobe signal RASB is enabled to the logic low level, the control signal PR rises to the logic high level to start the operation cycle.

SUMMARY OF THE INVENTION

It is therefore an object of the present invention to provide improved methods and circuits for generating internal booster voltage levels for integrated circuit memory devices.

It is another object of the present invention to provide internal booster power sources for memory devices which reduce power dissipation.

It is still another object of the present invention to provide internal booster power sources for memory devices which increase the reliability of the memory device.

These and other objects of the present invention are provided by semiconductor memory devices including a boosting voltage generator, a plurality of active kickers, and a controller. The boosting voltage generator provides a word line with a boosting voltage of an internal source voltage. The plurality of active kickers perform active kicking operations for different refresh modes wherein the active kickers are connected in parallel with an output terminal of the boosting voltage generator. The controller provides an active enable terminal of each of the active kickers with control signals for operating any of the active kickers in a given refresh mode having a relatively low power consumption among the refresh modes. In particular, the number of active kickers operating in a 4K refresh mode can be less than a number of the kickers operating in a 1K refresh mode wherein the refresh modes are respectively set to 4K and 1K refresh modes.

The memory devices and methods of the present invention can thus reduce the power consumption of a semiconductor memory device by selectively driving kickers in an active kicker group which includes a plurality of boosting voltage active kickers which generate a boosting voltage in response to inputs of a control signal (PR) and active kicker enable signals (PAK and PEF) which are enabled in a given refresh mode (4K). For example, because the number of cells operated in the refresh cycle 4K corresponds to a quarter of those operated in the refresh cycle 1K, the power consumed during the 4K and 1K refresh cycles changes in proportion to the ratio of the number of cells in the refresh cycle 4K to that in the refresh cycle 1K. Upon initiation of the refresh mode when the control signal (PR) is enabled and the refresh cycle indicative of the refresh mode is set to 1K, all of the kickers in the active kicker group with a signal (Ref) transmitted at a logic low level are activated. When the refresh cycle is set to 4K, however, only two active kickers are activated when the signal Vref is transmitted at a logic "high" level.

The memory devices and methods of the present invention thus reduce the power consumed by selectively enabling the active kickers of the active kicker group in accordance with the refresh in the semiconductor memory device which has the active kicker group including a plurality of active kickers while providing an adequate boosting voltage.

Alternately, methods are provided according to the present invention for controlling an internal booster power source in an integrated circuit memory device including a plurality of voltage booster active kickers. In particular, these methods include the steps of activating a first predetermined number of the voltage booster active kickers during a first voltage boost operation for the integrated circuit memory device, and activating a second predetermined number of the booster active kickers during a second voltage boost operation for the integrated circuit memory device. In particular, the second predetermined number is greater than the first predetermined number. Accordingly, a lesser charge can be generated during the first voltage boost operation, and a greater charge can be generated during the second boost operation. This method thus allows a single internal booster power source to provide different charges as needed in different voltage boost operations.

In particular, the plurality of voltage booster active kickers can include four voltage booster active kickers, and the first predetermined number can be two and the second predetermined number can be four. Accordingly, two voltage booster active kickers can be activated during the first boost operation, and four voltage booster active kickers can be activated during the second boost operation. Furthermore, the first predetermined number of the voltage booster active kickers can be activated responsive to an enabled row address strobe signal, an enabled booster voltage active control signal, and a disabled refresh cycle control signal. The second predetermined number of voltage booster active kickers can be activated responsive to an enabled row address strobe signal, an enabled booster voltage active control signal, and an enabled refresh cycle control signal.

According to still another alternate aspect of the present invention, an integrated circuit memory device includes a plurality of voltage booster active kickers connected to a booster voltage power line. An activation circuit is connected to the plurality of voltage booster active kickers wherein the activation circuit activates a first plurality of the voltage booster active kickers during a first voltage boost operation of the integrated circuit memory device. The activation circuit activates a second plurality of the voltage booster active kickers during a second voltage boost operation of the integrated circuit memory device. This integrated circuit memory device can also include a standby booster voltage generator connected to the booster voltage power line.

According to the circuits and methods of the present invention, the reliability of an integrated circuit memory device can be increased.

DETAILED DESCRIPTION

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 3:
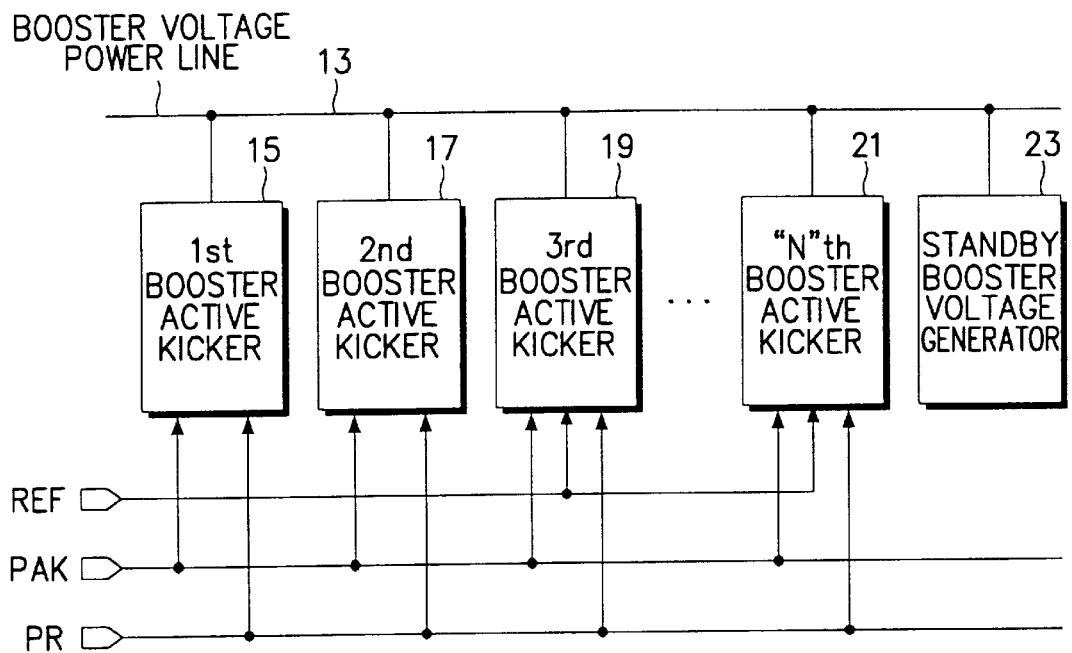
FIG. 3 is a block diagram illustrating an internal booster power source according to the present invention.
Figure 4:
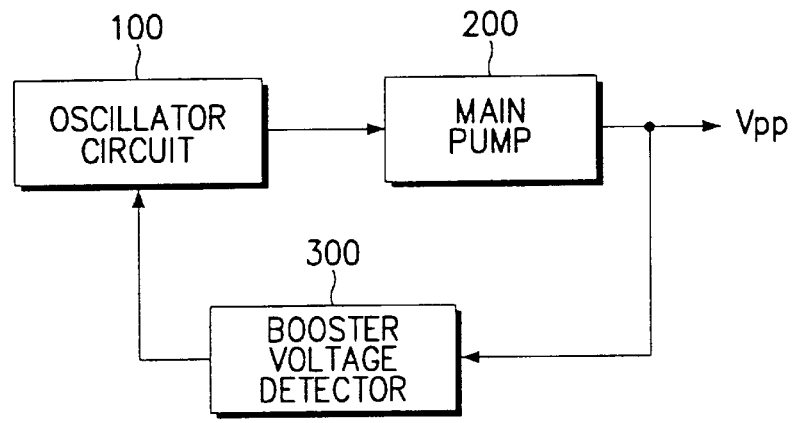
FIG. 4 is a block diagram illustrating the standby booster voltage generator of FIG. 3.

Referring to FIG. 3, the internal booster power source of the present invention includes a plurality of booster voltage active kickers 15, 17, 19, and 21 which are controlled by the booster voltage active kicker control signal PAK and the refresh cycle control signal REF during refresh cycles. The standby booster voltage generator 23 includes an oscillator circuit 100, a main pump 200, and a booster voltage detector 300 as shown in FIG. 4. The oscillator circuit 100 generates oscillating signals, and the main pump 200, which is connected to the oscillator circuit, generates the booster voltage signal Vpp by pumping in response to the oscillating signals. The booster voltage detector 300 detects the booster voltage level to control the oscillator circuit. As shown in FIG. 3, the standby booster voltage generator is connected to the booster voltage power line 13 to which the booster voltage Vpp is applied.

Figure 5:
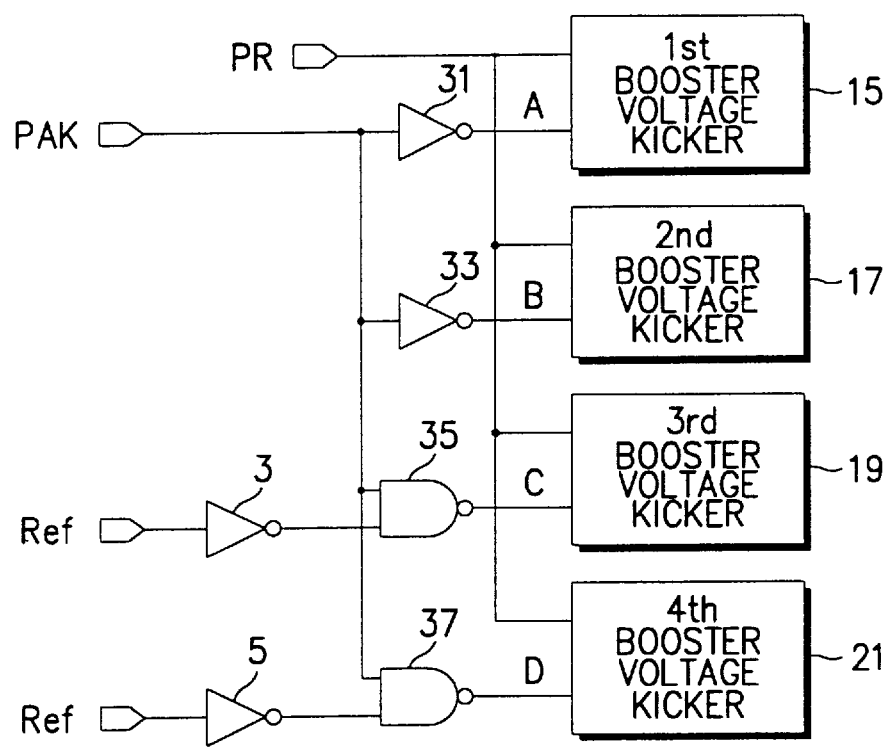
FIG. 5 is a block diagram illustrating a circuit for processing the control signals of FIG. 3.

The control circuit of FIG. 5 is used to process the control signals of FIG. 3. In particular, this control circuit includes the inverters 31 and 33, the NAND gates 35 and 37, and the booster voltage active kickers 15, 17, 19, and 21. As shown, the control signal PR is provided directly to each of the booster voltage active kickers, and the booster voltage active kicker control signal PAK is provided to each of the booster voltage active kickers via the inverters 31 and 33 and the NAND gates 35 and 37. The refresh cycle control signal Ref is provided to the third and fourth booster voltage active kickers 19 and 21 through the inverters 3 and 5 and respective second inputs of NAND gates 35 and 37. The plurality of booster voltage active kickers are provided in the memory device so that the internal booster power is generated therein during refresh operations.

If the memory device is provided with sufficient electric charge for operation of a 1K refresh using four booster voltage active kickers, a number of activated booster voltage active kickers can be reduced in the case of 4K refresh because less charge is required for operation. Accordingly, not all of the booster voltage active kickers need to be activated during a 4K refresh. Instead, it is only necessary to activate a predetermined number of booster voltage active kickers which provide the charge used during a 4K refresh. The internal power source of the present invention thus provides the advantage that the number of activated booster voltage active kickers can be reduced for refresh cycles for fewer memory cells thus reducing excessive applied charges. Furthermore, a greater number of booster voltage active kickers can be activated for refresh cycles requiring greater charge dissipation, such as refresh cycles for a greater number of memory cells.

Figure 1:
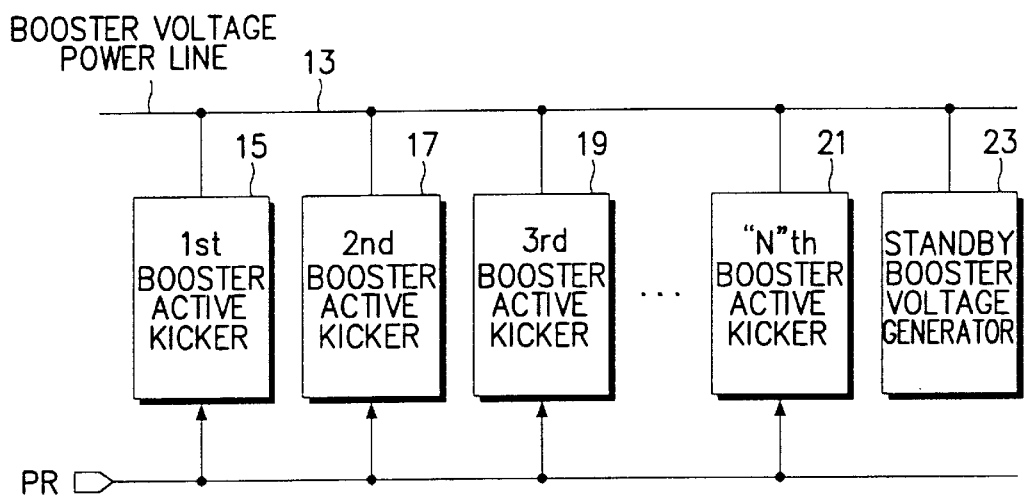
FIG. 1 is a block diagram illustrating an internal booster power source according to the prior art.
Figure 2:
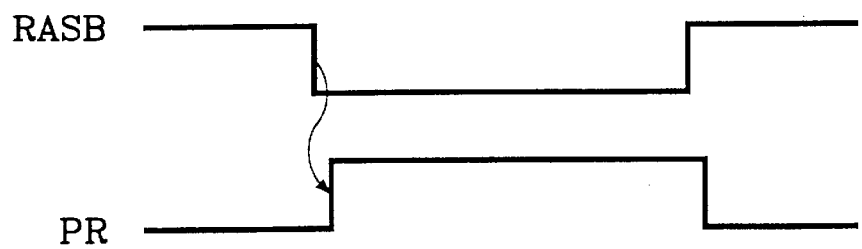
FIG. 2 is a timing diagram illustrating the operation of the PR signal of FIG. 1.
Figure 6:
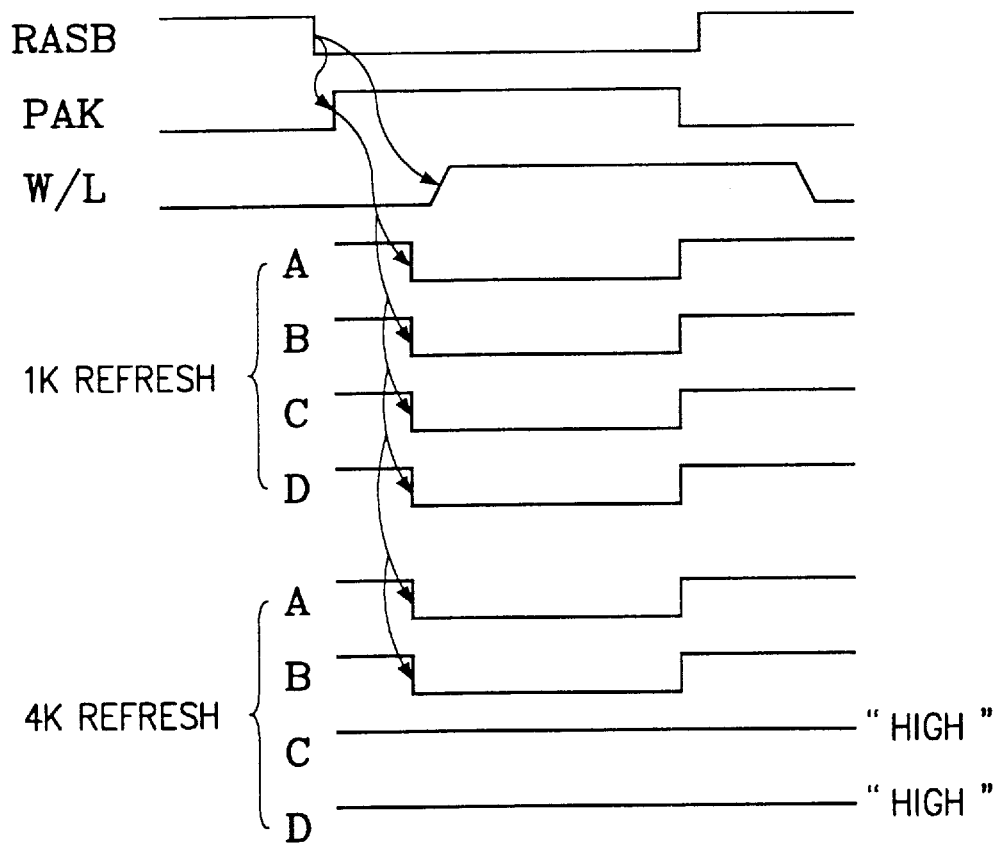
FIG. 6 is a timing diagram illustrating the operation of the internal booster power source of FIG. 3.

As shown in FIGS. 5 and 6, the booster voltage active kicker control signal PAK and the refresh cycle control signal Ref are logically combined by performing a NAND operation to activate respective booster voltage active kickers using logic low signals. In contrast, the active kickers of FIG. 2 are activated by enabling the control signal PR in response to the row address strobe signal RASB.

Accordingly, the inputs C and D of the third and fourth booster voltage active kickers 19 and 21 are at a logic high level when the refresh cycle signal Ref is at a logic high level so that the third and fourth booster voltage active kickers 19 and 21 are not activated. Four booster voltage active kickers are thus activated during a 1K refresh when the refresh cycle control signal Ref is at the logic low level, and two booster voltage active kickers are activated during a 4K refresh when the refresh cycle control signal Ref is at the logic high level. As discussed above, the internal power source of the present invention provides the advantage that the number of activated booster voltage active kickers can be reduced to prevent an excessive electric charge from being generated thus reducing malfunctions of the memory device as well as improving reliability thereof.

Figure 7:
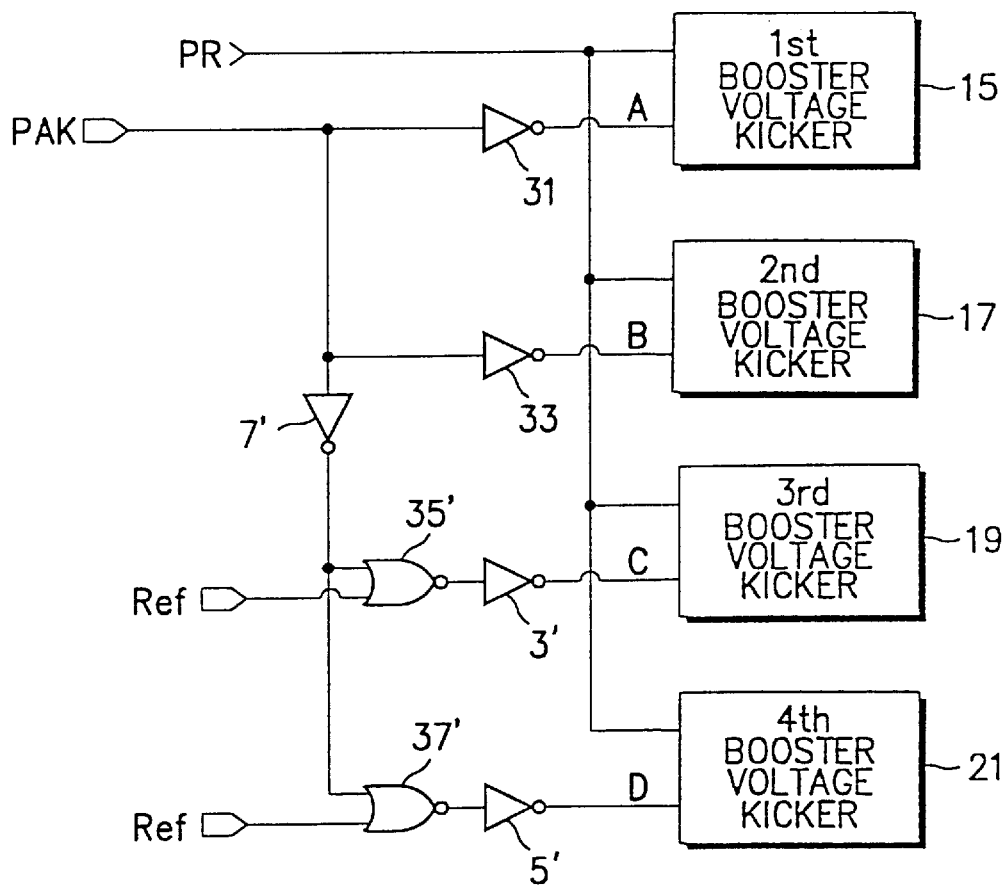
FIG. 7 is a block diagram illustrating a second standby booster voltage generator of FIG. 3 wherein the booster voltage active kicker control signal and the refresh cycle control signal are combined using a NOR operation.

In other words, a method is provided for controlling an internal booster power source of an integrated circuit memory device. This method includes the step of operating a plurality of booster voltage active kickers of the integrated circuit memory device responsive to a booster voltage active kicker control signal and a refresh cycle control signal when a row address strobe signal is enabled. The booster voltage active kicker control signal and the refresh cycle control signal are combined while the row address strobe signal is enabled to determine a number of the plurality of booster voltage active kickers of the integrated circuit memory device to be activated. In addition, an electrical signal is applied to an internal power line of the integrated circuit memory device, wherein the electrical signal is generated by the activated booster voltage active kickers responsive to the row address strobe signal and the booster voltage control signal. Moreover, the booster voltage active kicker control signal and the refresh cycle control signal can be combined using a NOR operation. In addition, the operating and combining steps can proceed simultaneously or separately. As shown in FIG. 7, the booster voltage active kicker control signal and the refresh cycle control signal can be combined using NOR gates 35' and 37' and Inverters 3', 5', and 7'.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A semiconductor memory device comprising:
   a boosting voltage generator which provides a word line with a boosting voltage of an internal source voltage;
   a plurality of active kickers for performing active kicking operations for different refresh modes, wherein said active kickers are connected in parallel with an output terminal of said boosting voltage generator; and
   a controller which provides an active enable terminal of each of said active kickers with control signals for operating any of said active kickers in a given refresh mode having a relatively low power consumption among said refresh modes;
   wherein a number of said active kickers operating in a 4K refresh mode is less than a number of said active kickers operating in a 1K refresh mode wherein said refresh modes are respectively set to 4K and 1K refresh modes.

2. A method for controlling an internal booster power source of an integrated circuit memory device, said method comprising the steps of:
   operating a plurality of booster voltage active kickers of the integrated circuit memory device responsive to a booster voltage active kicker control signal and a refresh cycle control signal when a row address strobe signal is enabled;
   combining said booster voltage active kicker control signal and said refresh cycle control signal while said row address strobe signal is enabled to determine a number of said plurality of booster voltage active kickers of the integrated circuit memory device to be activated; and
   applying an electrical signal to an internal power line of the integrated circuit memory device, wherein said electrical signal is generated by said activated booster voltage active kickers responsive to said row address strobe signal and said booster voltage control signal;
   wherein said booster voltage active kicker control signal and said refresh cycle control signal are combined using a NOR operation.

3. A method for controlling an internal booster power source of an integrated circuit memory device, said method comprising the steps of:
   operating a plurality of booster voltage active kickers of the integrated circuit memory device responsive to a booster voltage active kicker control signal and a refresh cycle control signal when a row address strobe signal is enabled;
   combining said booster voltage active kicker control signal and said refresh cycle control signal while said row address strobe signal is enabled to determine a number of said plurality of booster voltage active kickers of the integrated circuit memory device to be activated; and
   applying an electrical signal to an internal power line of the integrated circuit memory device, wherein said electrical signal is generated by said activated booster voltage active kickers responsive to said row address strobe signal and said booster voltage control signal;
   wherein said booster voltage active kicker control signal and said refresh cycle control signal are combined using a NAND operation.

4. A method for controlling an internal booster power source of an integrated circuit memory device, said method comprising the steps of:
   operating a plurality of booster voltage active kickers of the integrated circuit memory device responsive to a booster voltage active kicker control signal and a refresh cycle control signal when a row address strobe signal is enabled;
   combining said booster voltage active kicker control signal and said refresh cycle control signal while said row address strobe signal is enabled to determine a number of said plurality of booster voltage active kickers of the integrated circuit memory device to be activated; and
   applying an electrical signal to an internal power line of the integrated circuit memory device, wherein said electrical signal is generated by said activated booster voltage active kickers responsive to said row address strobe signal and said booster voltage control signal;
   wherein said operating and combining steps proceed simultaneously.

5. A method for controlling an internal booster power source of an integrated circuit memory device, said method comprising the steps of:
   operating a plurality of booster voltage active kickers of the integrated circuit memory device responsive to a booster voltage active kicker control signal and a refresh cycle control signal when a row address strobe signal is enabled;
   combining said booster voltage active kicker control signal and said refresh cycle control signal while said row address strobe signal is enabled to determine a number of said plurality of booster voltage active kickers of the integrated circuit memory device to be activated: and
   applying an electrical signal to an internal power line of the integrated circuit memory device, wherein said electrical signal is generated by said activated booster voltage active kickers responsive to said row address strobe signal and said booster voltage control signal;
   wherein said operating and combining steps proceed separately.

6. A method for controlling an internal booster power source in an integrated circuit memory device including a plurality of voltage booster active kickers, said method comprising the steps of:

activating a first predetermined number of said voltage booster active kickers during a first voltage boost operation for the integrated circuit memory device; and activating a second predetermined number of said voltage booster active kickers during a second voltage boost operation for the integrated circuit memory device wherein said second predetermined number is greater than said first predetermined number.

7. A method according to claim 6 wherein said first voltage boost operation is performed during a first refresh operation for a first predetermined number of memory cells, wherein said second voltage boost operation is performed during a second refresh operation for a second predetermined number of memory cells, and wherein said second predetermined number of memory cells is greater than said first predetermined number of memory cells.

8. A method according to claim 6 wherein said plurality of voltage booster active kickers includes four voltage booster active kickers and wherein said first predetermined number is two and said second predetermined number is four.

9. A method according to claim 6 wherein said first predetermined number of said voltage booster active kickers are activated responsive to an enabled row address strobe signal, an enabled booster voltage active control signal, and a disabled refresh cycle control signal, and wherein said second predetermined number of said voltage booster active kickers are activated responsive to an enabled row address strobe signal, an enabled booster voltage active control signal, and an enabled refresh cycle control signal.

10. An integrated circuit memory device comprising:

a plurality of voltage booster active kickers connected to a booster voltage power line of the integrated circuit memory device; and an activation circuit connected to said plurality of voltage booster active kickers wherein said activation circuit activates a first predetermined number of said voltage booster active kickers during a first voltage boost operation of the integrated circuit memory device and wherein said activation circuit activates a second predetermined number of said voltage booster active kickers during a second voltage boost operation of the integrated circuit memory device.

11. An integrated circuit memory device according to claim 10 wherein said second predetermined number of voltage booster active kickers is greater than said first predetermined number of voltage booster active kickers.

12. An integrated circuit memory device according to claim 11 wherein said first voltage boost operation is performed during a first refresh operation for a first predetermined number of memory cells, wherein said second voltage boost operation is performed during a second refresh operation for a second predetermined number of memory cells, and wherein said second predetermined number of memory cells is greater than said first predetermined number of memory cells.

13. An integrated circuit memory device according to claim 10 further comprising a standby booster voltage generator connected to said booster voltage power line, wherein said standby booster voltage generator generates a standby booster voltage on said booster voltage power line during standby operations.

14. An integrated circuit memory device according to claim 11 wherein said plurality of voltage booster active kickers includes four voltage booster active kickers and wherein said first predetermined number of voltage booster active kickers is two and said second predetermined number of voltage booster active kickers is four.

15. An integrated circuit memory device according to claim 10 wherein said first predetermined number of said voltage booster active kickers are activated responsive to an enabled row address strobe signal, an enabled booster voltage active control signal, and a disabled refresh cycle control signal, and wherein said second predetermined number of said voltage booster active kickers are activated responsive to an enabled row address strobe signal, an enabled booster voltage active control signal, and an enabled refresh cycle control signal.

* * * * *